United States Patent [19]
Gilbert

[11] Patent Number: 6,011,431
[45] Date of Patent: Jan. 4, 2000

[54] AUTOMATICALLY TRACKING MULTIPLE-POLE ACTIVE FILTER

[75] Inventor: Barrie Gilbert, Portland, Oreg.

[73] Assignee: Analog Devices, Inc., Norwood, Mass.

[21] Appl. No.: 08/486,537

[22] Filed: Jun. 7, 1995

Related U.S. Application Data

[63] Continuation-in-part of application No. 08/344,361, Nov. 23, 1994, Pat. No. 5,489,878.

[51] Int. Cl.$^7$ ..................................................... H03K 5/00
[52] U.S. Cl. ......................... 327/553; 327/552; 327/563; 327/551; 330/305
[58] Field of Search ................................... 327/551, 552, 327/553, 563, 317, 103, 554, 555, 556, 557, 558, 559, 560; 330/303, 305, 306

[56] References Cited

U.S. PATENT DOCUMENTS

| | | | |
|---|---|---|---|
| 5,023,491 | 6/1991 | Koyama | 327/553 |
| 5,155,395 | 10/1992 | Motte' | 327/552 |
| 5,172,076 | 12/1992 | Brown | 331/57 |
| 5,200,716 | 4/1993 | Amano | 327/553 |

FOREIGN PATENT DOCUMENTS

| | | | |
|---|---|---|---|
| 4032311 | 2/1992 | Japan | 327/552 |

OTHER PUBLICATIONS

"Analogue IC design: the current–mode approach," Chapter 2 entitled "Current–mode Circuits From A Translinear Viewpoint: A Tutorial" by Barrie Gilbert, Peter Peregrinus Ltd., pp. 10–91, 1990.

"Analogue IC design: the current–mode approach," Chapter 6 entitled "Bipolar Current Mirrors" by Barrie Gilbert, IEE Circuits and Systems Series 2, pp. 239–296.

Excerpts from "Analysis and Design of Analog Integrated Circuits" by Paul Gray and Robert Meyer, pp. 452–457 and 536–551, 1984.

*Primary Examiner*—Timothy P. Callahan
*Assistant Examiner*—Dinh T. Le
*Attorney, Agent, or Firm*—Marger Johnson & McCollom, P.C.

[57] ABSTRACT

An operational amplifier connected in a voltage follwer configuration includes a variable current source in the input stage to vary the transconductance of the differential pair of transistors that form the input stage of the op-amp. A first filter pole is formed by the transconductance of the differential pair of transistors and the capacitance of a compensation capacitor used to internally compensate the op-amp. A pair of cascode transistors are connected in series with the differential pair of transistors and a cascode capacitor is coupled between the pair of cascode transistors so that a second filter pole is formed having a corner frequency that is a function of the transconductance of the pair of cascode transistors and the capacitance of the cascode capacitor. This second pole tracks with the first pole because the same current flows through the cascode transistors as through the differential pair of transistors. Additional poles are added by inserting additional pairs of cascode transistors and associated cascode capacitors in a similar manner. Thus, the invention forms a tunable N-pole filter.

15 Claims, 11 Drawing Sheets

AUTOMATICALLY TRACKING MULTIPLE-POLE ACTIVE FILTER

This invention is a continuation-in-part of previously filed application Ser. No. 08/344,361, filed Nov. 23,1994, which has now issued as U.S. Pat. No. 5,489,878, issued Feb. 6, 1996.

BACKGROUND OF THE INVENTION

This invention relates generally to filters and more particularly to tunable filter circuits.

Figure 1:
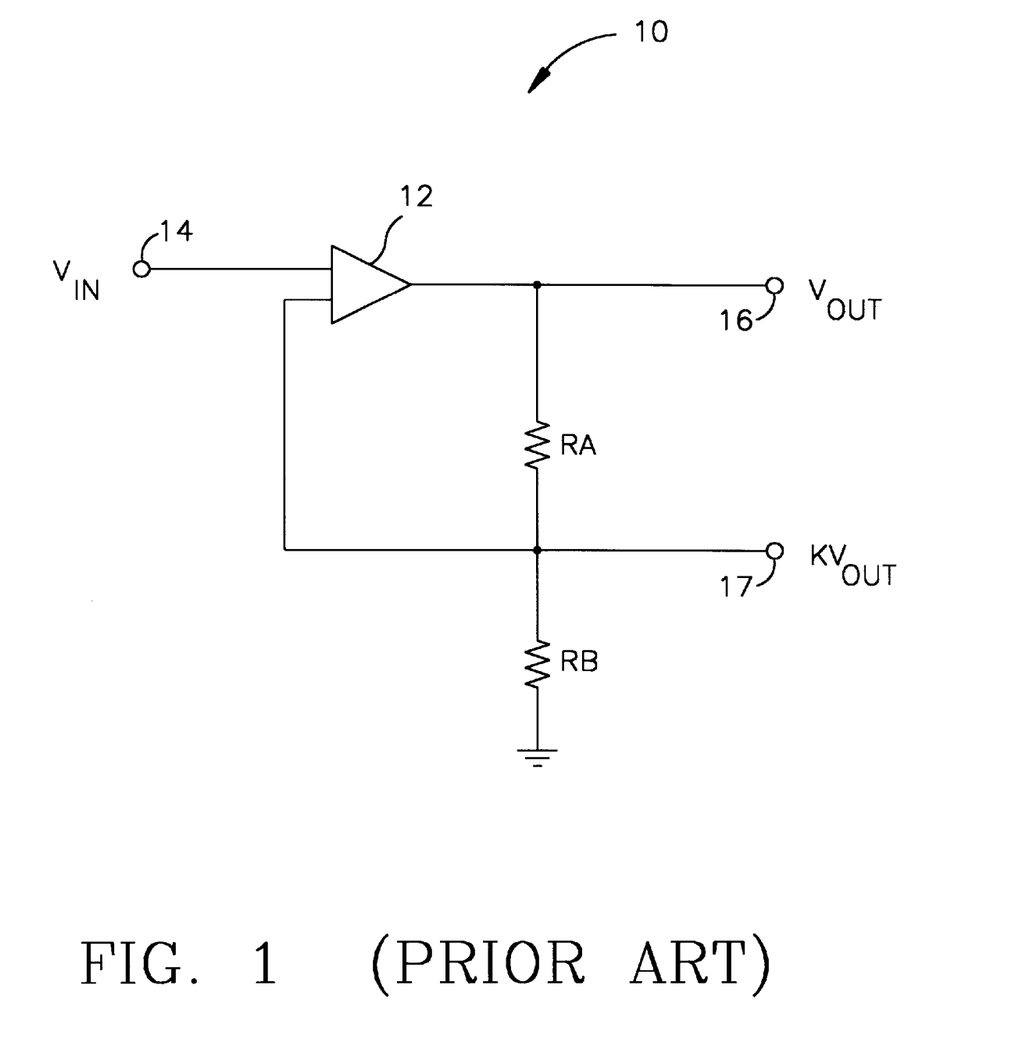
FIG. 1 is a prior art so-called active R filter.

Many applications require a filter whose corner frequency is variable. These filter circuits are referred to as "tunable" because the corner frequency can be varied or "tuned" responsive to some external variable. An example of what could be considered a tunable filter is shown in FIG. 1. The filter 10 in FIG. 1 has been referred to as an "Active R Filter." The filter 10 includes an operational amplifier (op-amp) 12 and a resistor divider network comprised of resistors RA and RB.

Much analysis has been performed on the frequency response of the basic op-amp. See, e.g., Paul R. Grey and Robert G. Meyer, ANALYSIS AND DESIGN OF ANALOG INTEGRATED CIRCUITS 452–457 (2d ed. 1984) (analyzing the frequency response of the ubiquitous 741 op-amp). It is well known that the frequency response of an op-amp is dominated by an internal compensation capacitor ($C_c$), which is provided to ensure stability of the op-amp. The compensation capacitor and an equivalent resistance of the transconducance ($g_m$) stage form an RC time constant which produces a dominant pole in the op-amp.

The "active R filter" 10 uses the resistor divider network at the output of the op-amp to change the effective "R" of the time constant thereby varying the dominant pole of the op-amp. The filter 10, therefore, has a pole that can be "tuned" to a desired corner frequency by the appropriate selection of the resistor values. This approach has the advantage of producing a tunable filter using relatively few components.

There are several problems, however, with the active R filter approach. First, the unity gain frequency of the op-amp is notoriously unpredictable due to process variations in forming the components that comprise the equivalent resistance and the compensation capacitor. Thus, the corner frequency of the filter 10 cannot be varied with any degree of certainty. A second problem is that the unity gain frequency is temperature dependent. Third, the filter is nonlinear over a portion of its input operating range. Finally, the filter 10 has only a single pole, neglecting the poles due to the parasitic capacitances of the op-amp 12, which limits its application. While some of these problems can be overcome, to do so requires additional circuitry. Accordingly, a need remains for a tunable filter that does not suffer from the limitations of active R filters.

SUMMARY OF THE INVENTION

It is, therefore, an object of the invention to provide a simple, yet accurate, tunable N-pole filter.

A tunable filter comprised of an op-amp includes one or more filter poles whose corner frequency can be tuned by varying the current provided to the differential pair of input transistors that form the input stage of the op-amp. The invention takes advantage of the fact that the corner frequency of the dominant pole of an op-amp is linearly dependent on the transconductance ($g_m$) of the differential pair of transistors as well as the compensation capacitor. The transconductance is a function of the collector current of the transistor. The invention varies the corner frequency of the dominant pole in the op-amp by varying the collector current provided to these transistors.

The filter can include additional poles by connecting a pair of cascode transistors in series with the differential pair of transistors so that the same current flows through each pair. An associated cascode capacitor is coupled between each pair of cascode transistors so that an additional pole is formed whose corner frequency ($\omega_2$) is equal to the transconductance of the pair of cascode transistors ($g_{m2}$) divided by the capacitance of the cascode capacitor ($C_1$) (i.e., $\omega_2 = g_{m2}/C_1$). These additional poles tracks with the dominant pole because the same current flows through the cascode transistors as through the differential pair of transistors. The number of poles achievable in this way is limited only by the available supply voltage headroom. A pair of folded cascode transistors can also be used in place of the pair of cascode transistors.

In another aspect of the invention, the differential pair of transistors that form the input section of the filter are replaced by a so-called "multi-tanh doublet," which improves the linearity of the input stage and thus the filter. The multi-tanh doublet, as described further below, includes two transconductance ($g_m$) pairs each operating at different operating points.

An advantage of the present invention is that it can be extended to fully-differential embodiments.

The foregoing and other objects, features and advantages of the invention will become more readily apparent from the following detailed description of a preferred embodiment of the invention which proceeds with reference to the accompanying drawings.

DETAILED DESCRIPTION

Figure 2:
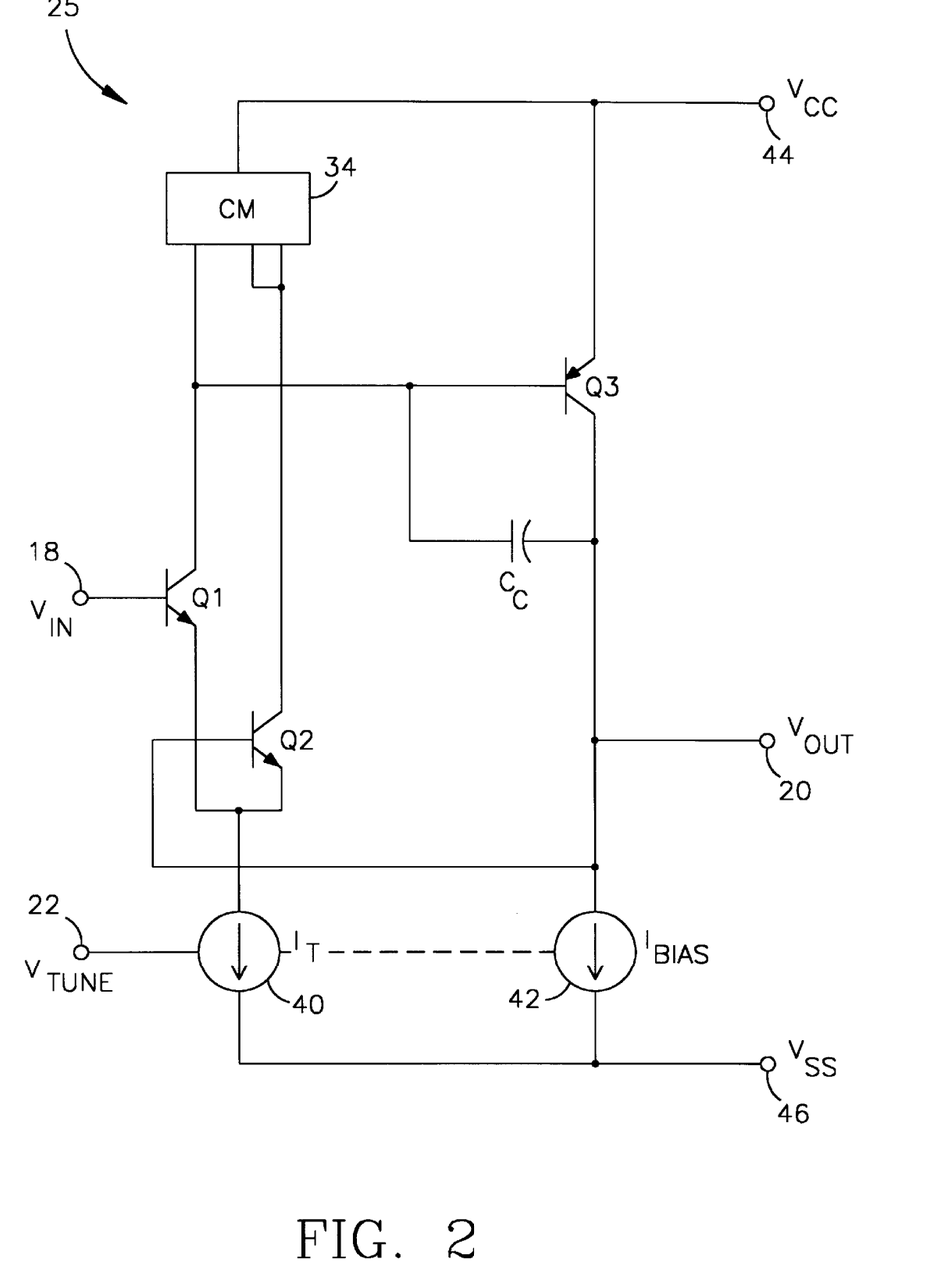
FIG. 2 is a single-pole tunable filter according to the invention.

A simple, single pole tunable filter 25 is shown in FIG. 2. The filter 25 is essentially an operational amplifier circuit connected in a voltage follower configuration with a variable current source 40. The filter 25 includes a differential pair of transistors Q1 and Q2 that are coupled to the variable current source 40. The transistors Q1 and Q2 form an input stage of the filter 25. The variable current source 40 is coupled to an input terminal 22 to receive a tuning signal $V_{TUNE}$, which in the preferred embodiment is a voltage. The current source 40 varies the current $I_T$ provided to the differential pair of transistors responsive to the tuning signal $V_{TUNE}$. The transconductance ($g_m$) of the differential pair, which is a function of the current $I_T$, can thus be varied by varying the tuning voltage $V_{TUNE}$.

The filter 25 also includes a current mirror 34 connected between a supply voltage terminal 44 and the pair of differential transistors Q1 and Q2. The current mirror 34 provides a pair of "mirrored" currents to the differential pair in the typical fashion, as is known in the art.

The base of Q1 is coupled to an input terminal 18 for receiving an input voltage $V_{IN}$. The base of Q2 is coupled to an output terminal 20 which configures the filter in a voltage follower configuration. An output voltage $V_{OUT}$ is produced on terminal 20, which is a filtered version of the input voltage $V_{IN}$.

The collector of transistor Q1 drives the base of an output transistor Q3, which is biased by a current source 42. Alternatively, a Darlington pair of transistors can be used in place of the single output transistor Q3. Although the current source 42 can provide a fixed bias current $I_{BIAS}$, alternatively the bias current $I_{BIAS}$ can also be responsive to the tuning voltage $V_{TUNE}$ (as indicated by the dotted line in FIG. 2) so that the two currents $I_{BIAS}$ and $I_T$ track each other. By making the making the two currents equal, as in the preferred embodiment, there is sufficient base current to correct for any errors due to finite beta ($\beta$).

As in prior art op-amps, a compensation capacitor $C_c$ is included to form a dominant pole. In can be shown that the unity gain or corner frequency of the op-amp ($\omega_1$) of this pole is given by the following expression:

$$\omega_1 = g_m/C_c$$

where $g_m$ is the transconductance of the differential pair of transistors Q1 and Q2 and Cc is the capacitance of the compensation capacitor. The invention takes advantage of the fact that the transconductance ($g_m$), and therefore the corner frequency $\omega_1$, is a function of the currents in the differential pair of transistors Q1 and Q2. Thus, by varying the current $I_T$, which is responsive to the tuning voltage $V_{TUNE}$, the corner frequency of the filter 25 can be tuned by varying the tuning signal $V_{TUNE}$.

Figure 3:
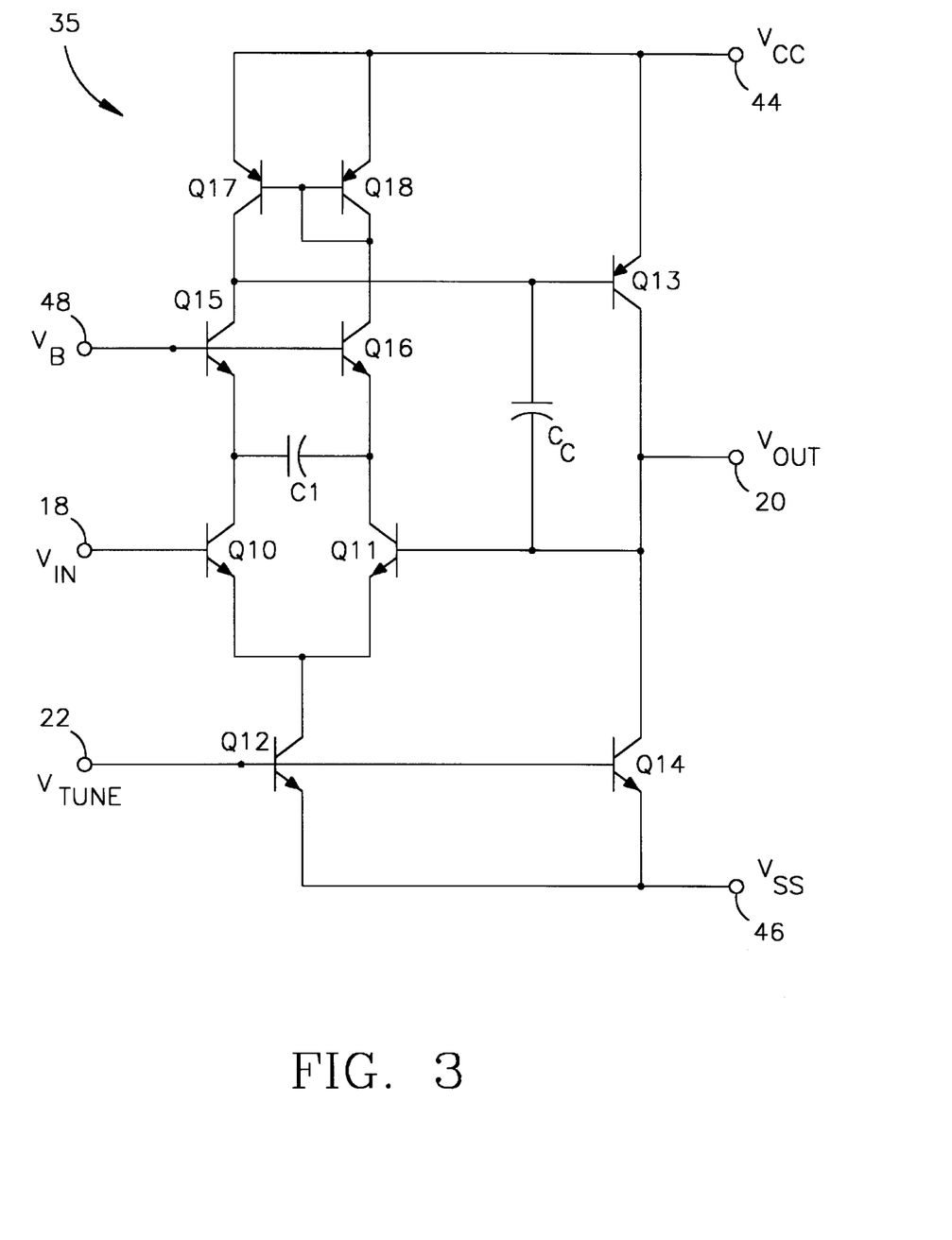
FIG. 3 is a tunable 2-pole filter according to the invention.

Referring now to FIG. 3, an automatically tracking 2-pole filter 35 is shown. The filter is referred to as "automatically tracking" because both poles track each other. The filter 35, as in the filter 25 shown in FIG. 4, includes a pair of differential transistors Q10 and Q11, which are coupled to a transistor Q12, that acts as a variable current source controlled by the tuning voltage $V_{TUNE}$. A compensation capacitor Cc is also included to form a first filter pole with the transconductance of the differential pair of transistors, as in filter 25.

The filter 35 also includes a single output transistor Q13, which is biased by a single transistor Q14. As described above, both current source transistors Q12 and Q14 are responsive to the tuning voltage $V_{TUNE}$ so that their currents track. A current mirror comprised of PNP transistors Q17 and Q18 is coupled between the supply voltage terminal 44 and the transistors Q10 and Q11, respectively.

Interposed between the current mirror transistors (Q17, Q18) and the differential pair of transistors (Q10, Q11) is a first pair of cascode transistors Q15 and Q16. Each cascode transistors Q15, Q16 is connected in series with a corresponding one of differential transistors Q10, Q11 so that the same current passes through the cascode transistor as through the associated differential transistor. The bases of the cascode transistors Q15 and Q16 are coupled to a bias input terminal 48 for receiving a first bias voltage $V_B$. A first cascode capacitor $C_1$ is coupled between the emitters of the two cascode transistors Q15 and Q16.

The filter 35 includes two poles: a first filter pole formed by the compensation capacitor ($C_c$) and the transconductance ($g_{m1}$) of the differential pair of transistors Q10 and Q11 (i.e., $\omega_1 = g_{m1}/C_c$), as in filter 25; and a second filter pole formed by the transconductance ($g_{m2}$) of the cascode transistors Q15 and Q16 and the cascode capacitor $C_1$ (i.e., $\omega_2 = g_{m2}/C_1$). This second, finite real pole automatically tracks the first pole because the cascode transistors always operate at the same current as the differential pair of transistors. This results in the essential response form in the closed-loop denominator of $1+sT/Q+s^2T^2$, where Q is simply the ratio $C_1/C_c$. Thus, an automatically tracking 2-pole filter has been realized.

Figure 8:
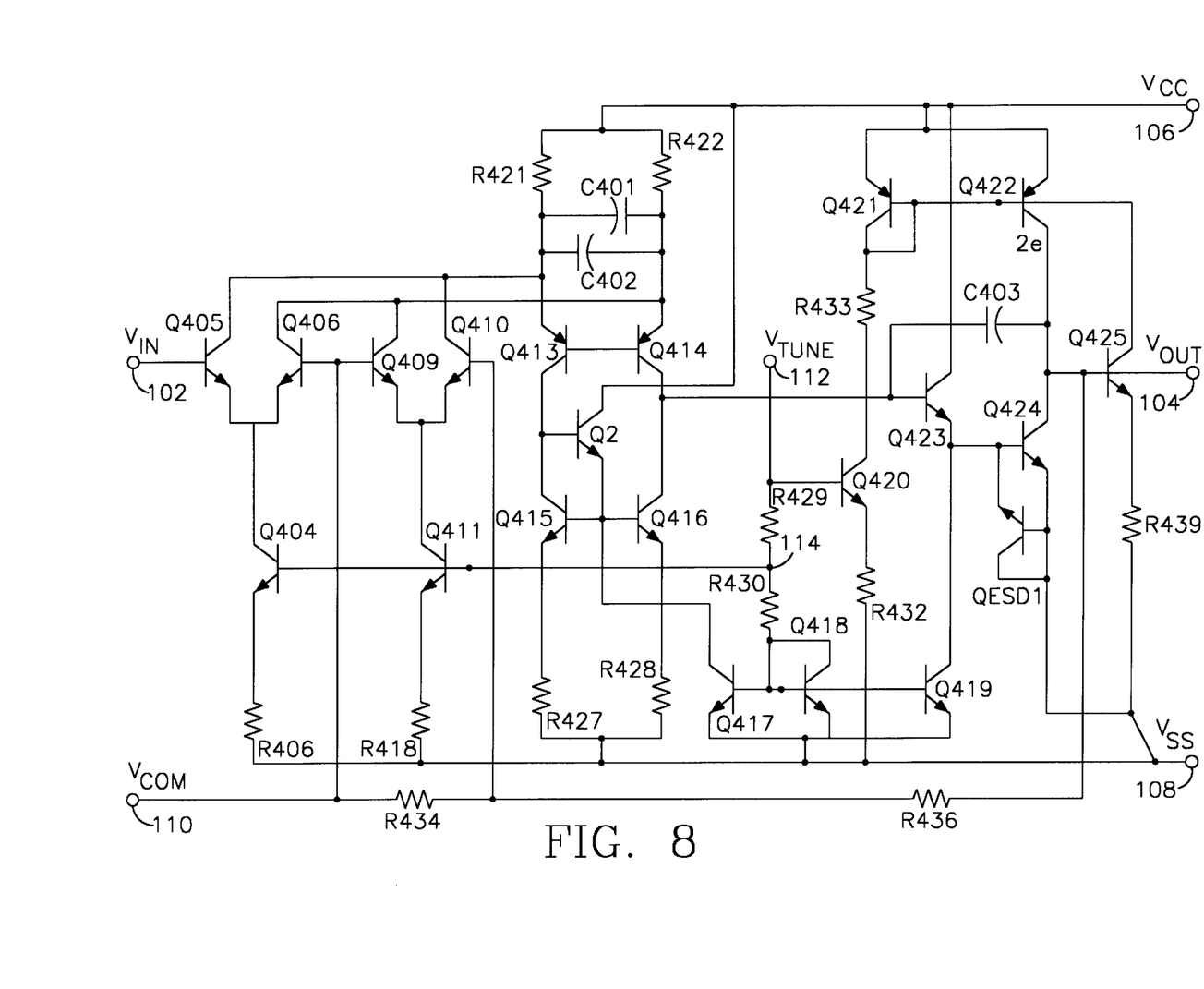
FIG. 8 is a complementary version of the tunable 2-pole filter using a folded-cascode according to the invention.

A complementary version of the filter 45 can be implemented by using PNP transistors in place of the NPN, wherein the cascode transistors Q15 and Q16 and arranged in a folded-cascode configuration. In this configuration, the current mirror would be implemented in NPN transistors rather than the PNP transistors. Such a complementary design is shown in FIG. 8, described further below.

Figure 4:
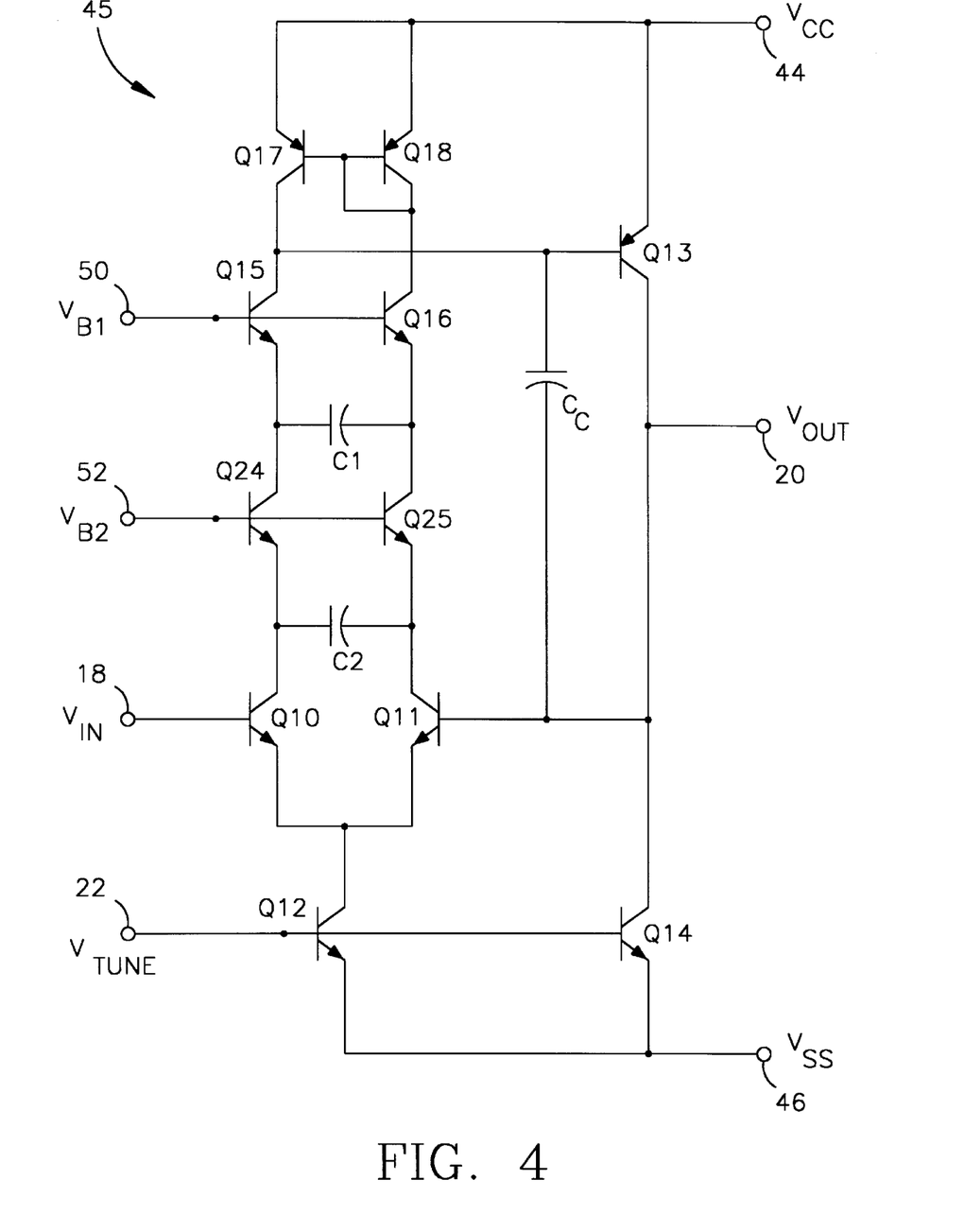
FIG. 4 is a tunable 3-pole filter according to the invention.

Referring now to FIG. 4, the invention has been extended to three poles by interposing a second pair of cascode transistors Q24 and Q25 between the first pair Q15 and Q16 and the differential pair of transistors Q11 and Q11. A second cascode capacitor C2 has also been added between the emitters of the second pair of cascode transistors. An additional bias input terminal 52 provides a second bias voltage $V_{B2}$ to the second pair of cascode transistors Q24 and Q25. It should be apparent based on the description above that the second pair of cascode transistors adds a third pole (i.e., $\omega_3 = g_{m3}/C_2$) to the open loop response, which again is controlled by the tuning signal $V_{TUNE}$ because the same current passes through the second pair of cascode transistors as through the other pairs of transistors. The inventive principle can thus be extended to N-poles in general, and is limited only by the available voltage supply headroom.

Figure 5:
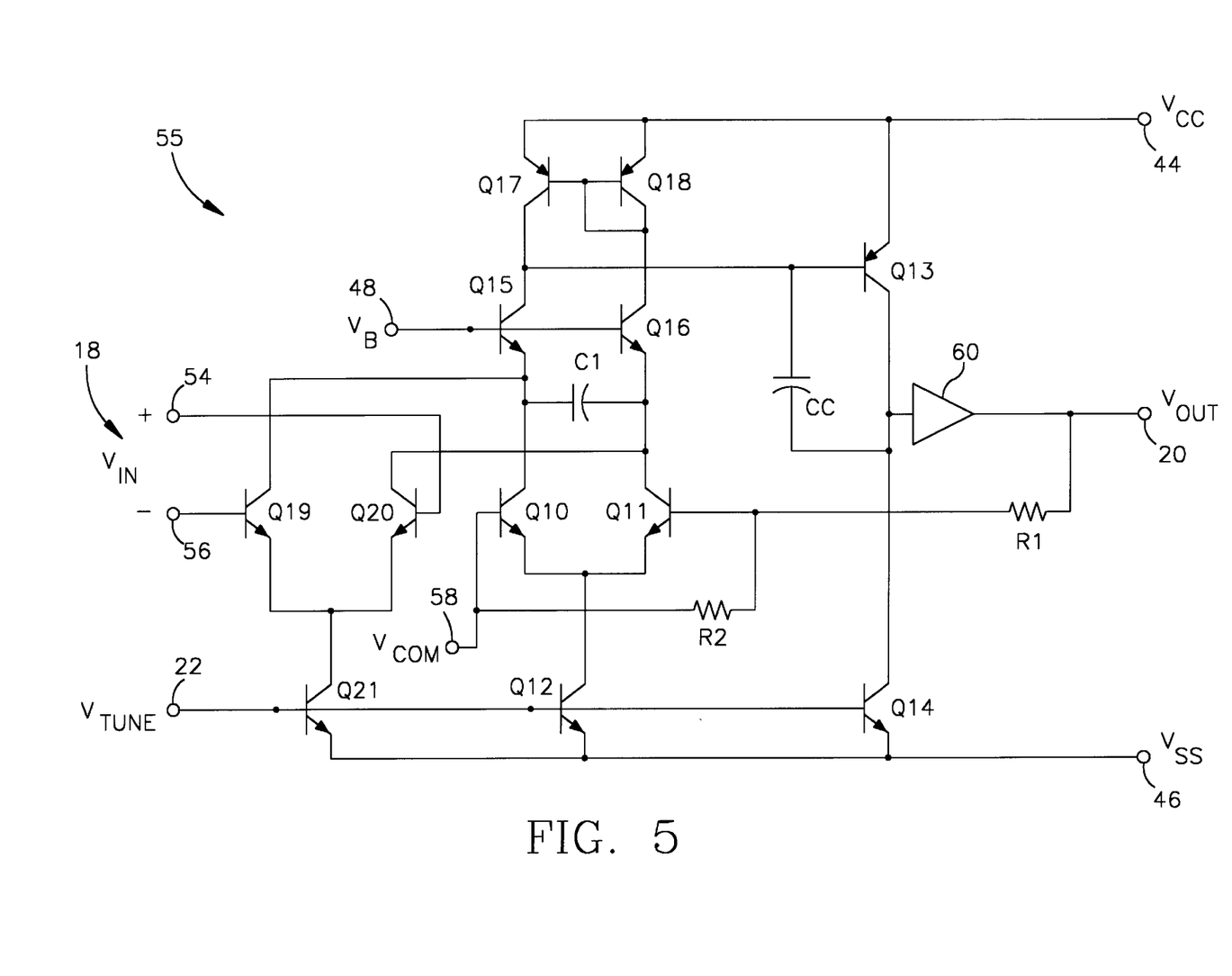
FIG. 5 is a tunable 2-pole filter having a differential input according to the invention.

Referring now to FIG. 5, an automatically tracking 2-pole filter 55 having a differential input 18 is shown. The filter 55 uses an active feedback scheme to provide the differential input 18. Filter 55 includes a second differential pair of transistors (Q19, Q20) having a pair of differential inputs (54, 56) for receiving a differential input voltage $V_{IN}$ and a pair of differential outputs coupled to the collectors of the first differential pair of transistors (Q10, Q11). A variable current source comprised of NPN transistor Q21 is coupled to the second differential pair of transistors (Q19, Q20) for biasing the second pair. The base of Q21 is coupled to the input terminal 22 for receiving the tuning voltage $V_{TUNE}$. Alternatively, as described above, the base of Q21 can be coupled to a fixed voltage so that a fixed bias current is supplied to Q19 and Q20.

The bases of the first differential pair of transistors Q10 and Q11 are coupled to a voltage $V_{COM}$ received at terminal 58, which in the preferred embodiment is approximately 2.5V for a nominal 5V supply. The voltage $V_{COM}$ is applied directly to the base of Q10 while provided to the base of Q11 through resistor R2. The base of Q11 is further coupled to the output terminal 20 via a feedback resistor R1, through which the output voltage $V_{OUT}$ is fed back to the differential pair Q10-Q11. The filter 55 further includes a buffer amplifier 60 coupled between the collector of Q13 and the output terminal 20.

These additional components convert the single-ended tunable filter 35 shown in FIG. 3 to a differential-input, single ended output filter. As with the filter 35 in FIG. 3, the filter 55 can be extended to N poles with the addition of additional pairs of cascode transistors and corresponding cascode capacitors. The operation of the filter 55, other than the differential input, is essentially the same as that described above with reference to FIGS. 3 and 4 and is therefore not repeated.

Figure 6:
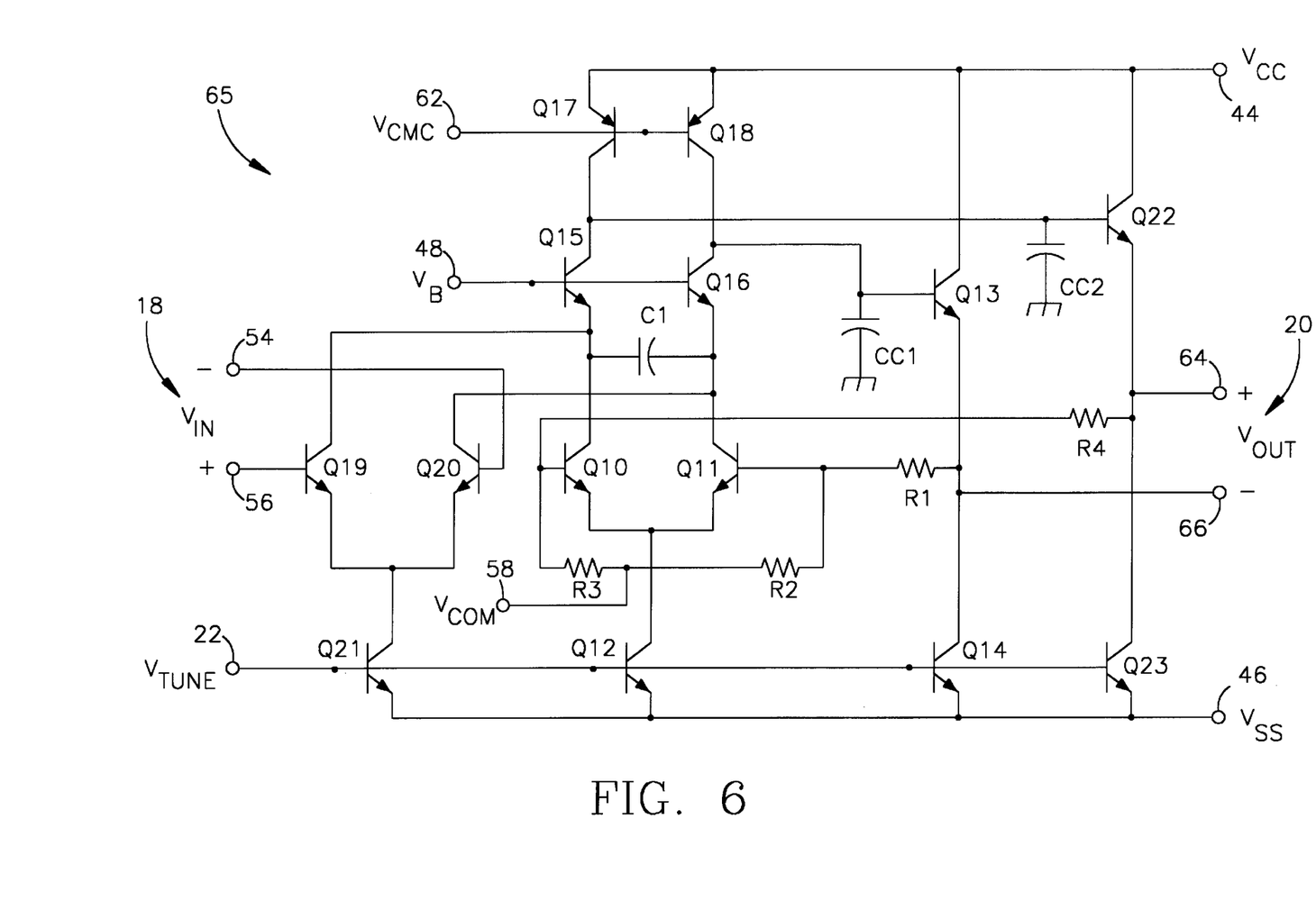
FIG. 6 is a fully differential tunable 2-pole filter according to the invention.

The basic filter design according to the invention can be further modified to be fully-differential with the addition of a differential output stage, as shown in FIG. 6. The filter 65 of FIG. 6 is fully-differential in that it receives a differential input voltage $V_{IN}$ at inputs 54 and 56 and produces a differential output voltage $V_{OUT}$ at outputs 64 and 66. The differential output stage includes a second output transistor Q22, with its associated bias transistor Q23. The first output 64 is coupled to the base of transistor Q10 via feedback resistor R4 while the second output 66 is coupled to the base of transistor Q11 via feedback resistor R1. The voltage $V_{COM}$ is supplied to terminal 58 and coupled to the bases of transistors Q10 and Q11 through resistors R3 and R2, respectively. In contrast to filter 55, the current mirror transistors Q17 and Q18 are biased individually by a common mode bias voltage $V_{CMC}$ provided to the bases of transistors Q17 and Q18 via terminal 62. This common mode bias voltage is generated by a common mode biasing circuit, which are known in the art and therefore not described herein.

The compensation capacitor is split up into two separate capacitors CC1 and CC2, with each capacitor coupled between the base of a respective emitter-follower transistor (Q13, Q22) and ground. The base of each transistor Q13 and Q22 is further coupled to the collector of a corresponding cascode transistor Q15 and Q16.

Figure 7:
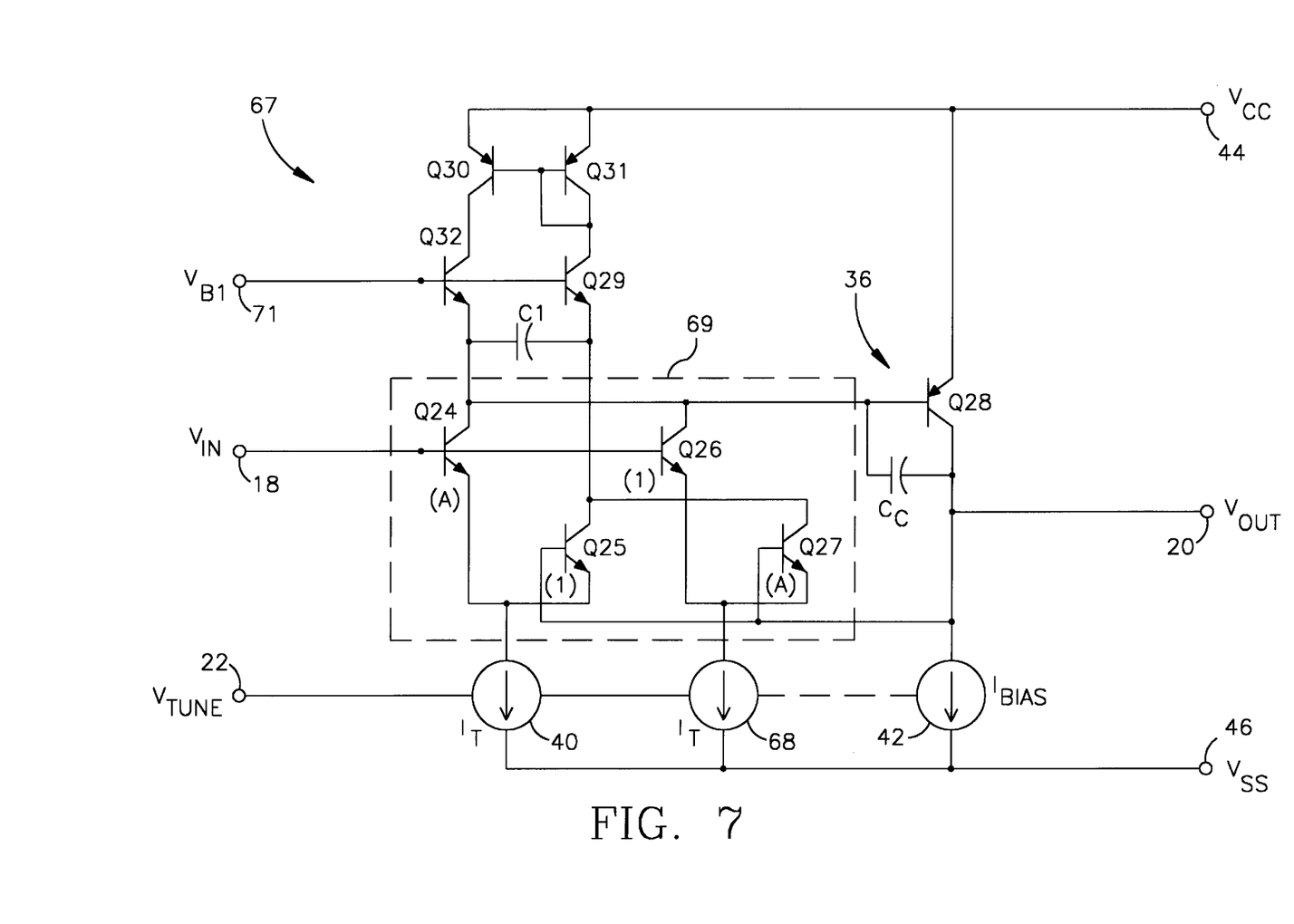
FIG. 7 is a tunable 2-pole filter with improved linearity according to the invention.

The filter 65 provides both differential input and differential output interfaces and is thus fully-differential. The differential input is provided by the same circuitry as in FIG. 7 while the differential output is provided by the additional output transistors and the associated changes in the biasing circuitry described above. The fully-differential version of the invention, as with the single-sided version, can also be extended to N poles with the addition of additional pairs of cascode transistors and associated cascode capacitors. The poles of filter 65, as with filters 35, 45, and 55, have corner frequencies that track or are responsive to the tuning voltage $V_{TUNE}$. Therefore, the invention has provided an automatically tracking N-pole filter that can be implemented in either single-sided or differential form, or a combination of the two.

The basic filter design can be further modified to provide improved linearity. The filter 67 of FIG. 7 includes a so-called "multi-tanh doublet" 69 in place of the differential pair of input transistors. The multi-tanh doublet 69 makes the filter response more linear by effectively combining two differential pairs into a single transconductance ($g_m$) stage. The multi-tanh doublet derives its name from the current versus voltage relationship of a simple BJT differential pair, which can be described by a hyperbolic tan function (tanh). The multi-tanh doublet includes two BJT differential pairs, each operating at different operating points due to the different emitter area ratios (A:1) so as to extend the linear range of the combined $g_m$ stage. A further description of the multi-tanh doublet is included in my co-pending, commonly assigned application entitled "Current-Controlled Quadrature Oscillator Based on Differential gm/C Cells," Ser. No. 08/344,361, incorporated herein by reference. This principle can be extended to any number of differential pairs yielding a generic multi-tanh n-tuplet to produce a further extended linear range of transconductance. These multi-tanh n-tuplets can be substituted for the simple differential pair of transistors (Q1, Q2) shown in the FIG. 2 and thereby increase the linearity of the filter.

Another embodiment of the invention which uses a folded-cascode is shown in FIG. 8. The folded cascode version 100 operates on the same principle as the other versions described above. One difference, besides the use of the folded cascode, is how the "tracking" is accomplished. In the embodiments described above, the pair cascode transistors were in series with the pair of transistors of the $g_m$ stage that formed the first pole so that the same current flowed through both pairs of transistors. This ensured that the cascode transistors and the transistors of the $g_m$ stage had the same transconductance and, thus, the same corner frequency. In this embodiment, the folded cascode transistors (Q413, Q414) and the input transistors (Q405, Q406, Q409, Q410) are biased to the same current level by a bias circuit.

The bias circuit is responsive to a tuning voltage $V_{TUNE}$ supplied to terminal 112. This tuning voltage establishes a current in Q420. This current produces a voltage across R433, minus a $V_{BE}$ across Q421, that is applied to the bases of the folded cascode transistors Q413 and Q414. The voltage at the bases of Q413 and Q414 establishes a bias current therein and therefore sets the transconductance of the two transistors.

The tuning voltage $V_{TUNE}$ also establishes a current through resistor R429 coupled to terminal 112. The current through R429 establishes a voltage at node 114 that is applied to the bases of current source transistors Q404 and Q411, that are coupled to $g_m$ pairs Q405-Q406 and Q409-Q110, respectively. The voltage at node 114 sets the bias current generated by the current source transistors Q404 and Q111 and therefore the current through the $g_m$ stages. Thus, the current through the $g_m$ stages, as in the folded cascode transistors, is responsive to the tuning voltage $V_{TUNE}$. Accordingly, both filter poles track each other and the tuning voltage.

Figure 9:
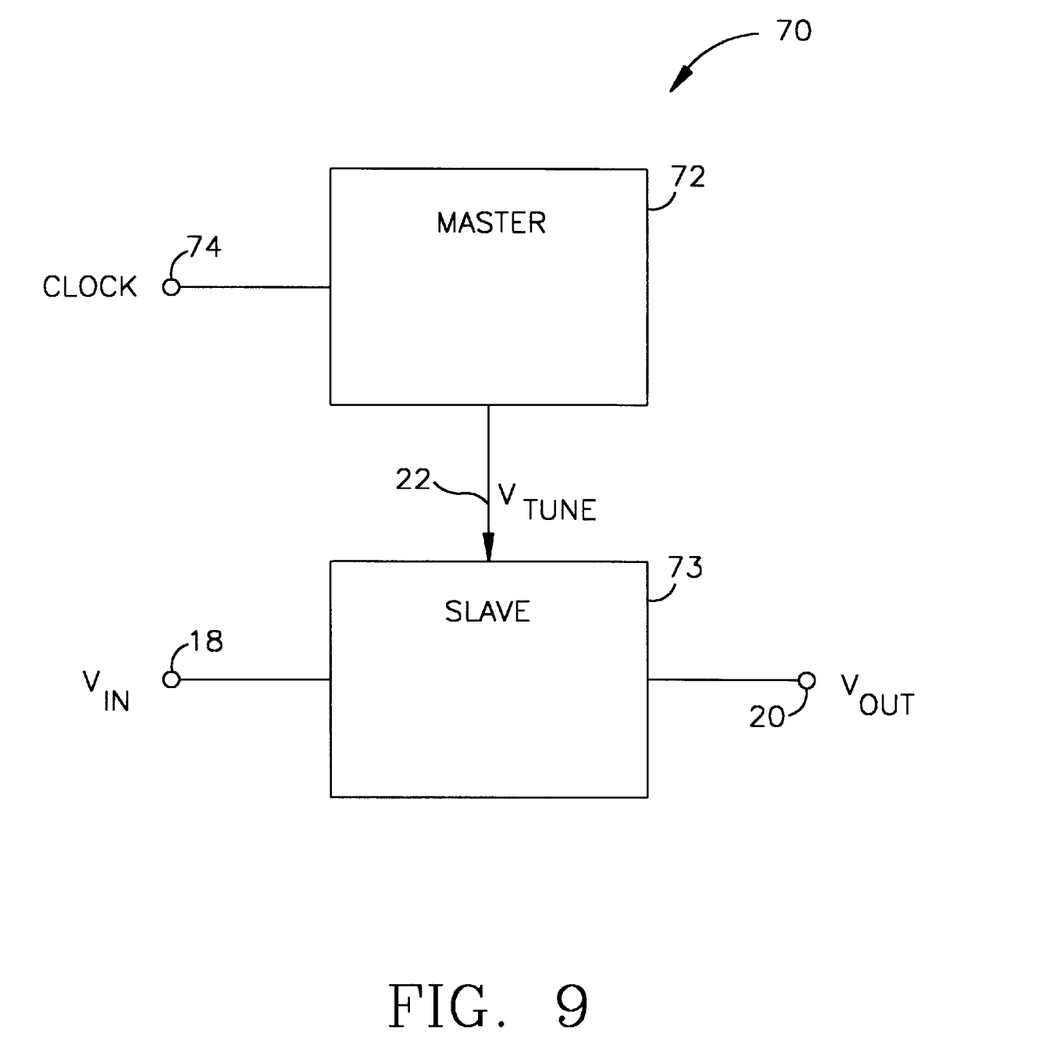
FIG. 9 is a master/slave continuous-time filter structure using e tunable filter according to the invention.

A problem with using the filters described above, as in the prior art, is that the corner frequency is a function of the capacitance values of the capacitors used to form the filter poles. These capacitances can vary by up to +/−15% due to normal variations in the semiconductor fabrication process. Accordingly, the corner frequency cannot be set with any degree of accuracy without some form of feedback control. To provide this added level of control, the filters according to the invention can be incorporated into a master/slave continuous-time filter structure 70 as shown in FIG. 9. The theory behind the master/slave circuits is that by using similar filters in both the master and slave and by using the same control signal to control them, the variations in the corner frequencies of the slave due to process variations can be cancelled by those in the master.

The master/slave filter 70 includes a master circuit 72 connected to a slave circuit 73 by a conductor 22, which provides a tuning signal $V_{TUNE}$ from the master to the slave. The slave circuit 73 is one of the tunable filters (25, 35, etc.) according to the invention described above. The master circuit 72 includes a clock input 74 to which a clock signal (CLOCK) is applied. The CLOCK signal, preferably provided by a crystal, provides an accurate time base for the circuit 70.

Figure 10:
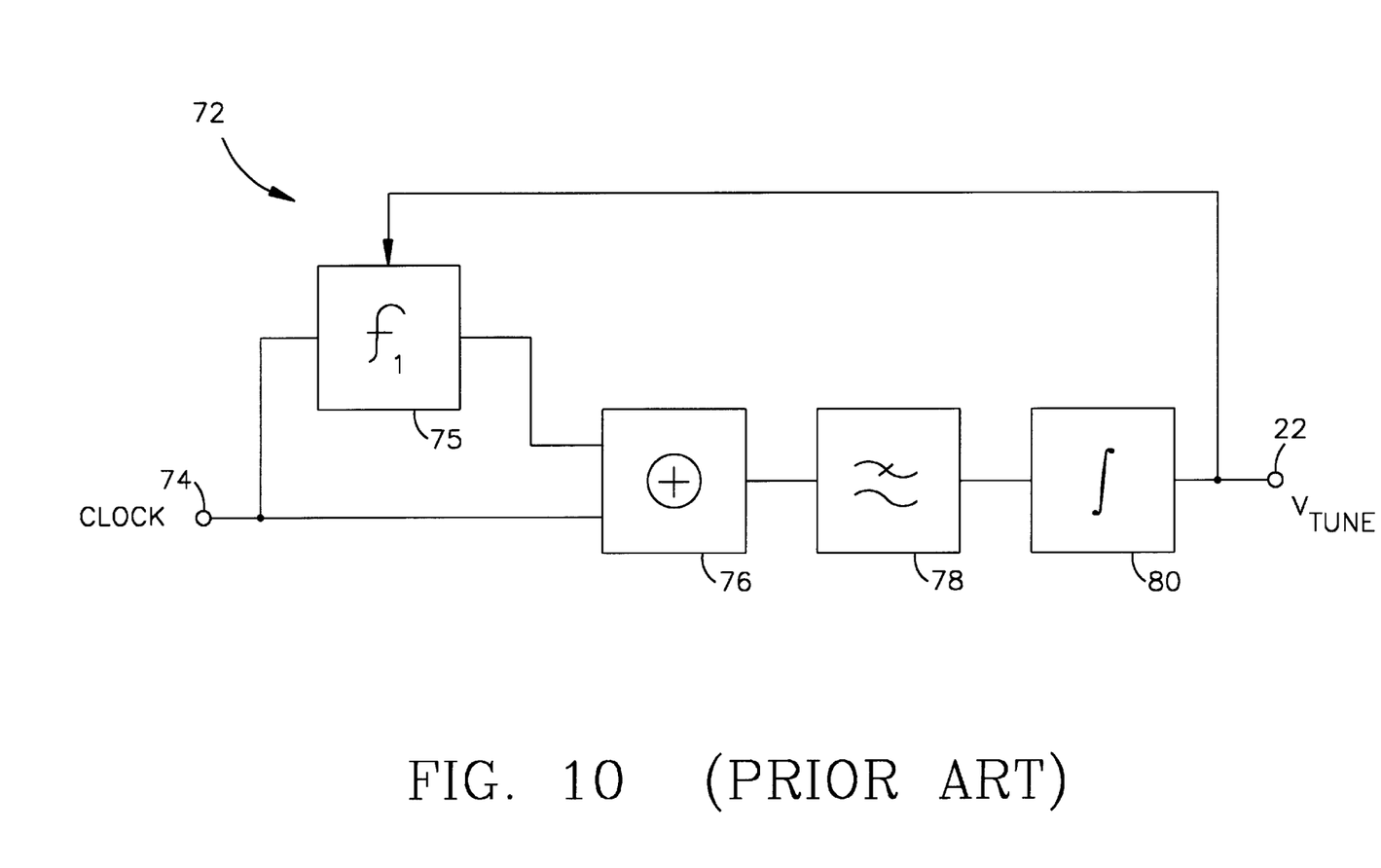
FIG. 10 is a prior art master circuit of FIG. 9.

An example of a prior art master circuit 72, which uses a 90 degree phase method, is shown in FIG. 10. The circuit 72 includes an active filter 75 which imparts a 90 degree phase shift to the clock signal at its corner frequency ($f_1$). The output of the active filter 75 is combined with the clock signal by an exclusive OR (XOR) circuit 76, which produces a mean zero output signal when the phase is 90 degree. This mean zero signal is then filtered by low pass filter 78 and integrated by integrator 80, which accumulates any residual error in the output of the filter 78. The output of the integrator 80 is the tuning signal $V_{TUNE}$, which is then applied to the active filter 75 to tune the filter to the frequency of the clock signal. The tuning signal can either be a voltage or current. It is preferable in many applications, however, that the tuning signal be a voltage to allow the signal to be dispersed throughout a circuit without requiring the signal to be replicated, which would be the case with a current. Eventually this circuit stabilizes so that the filter 75 is tuned to the clock signal.

Figure 11:
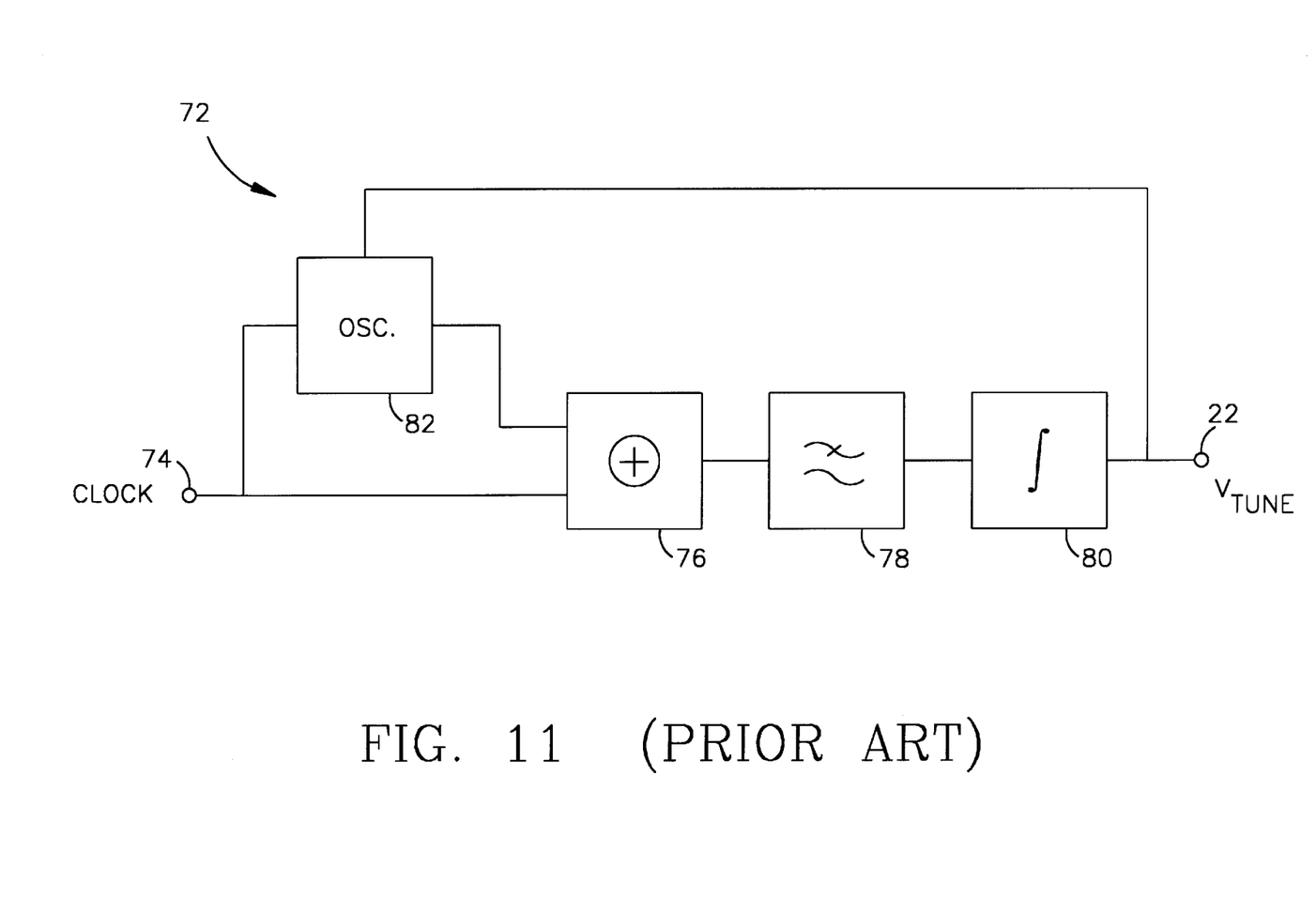
FIG. 11 is a prior art master circuit of FIG. 9.

Another prior art master circuit is shown in FIG. 11. This circuit is similar to the one shown in FIG. 10 except that the active filter 75 has been replaced by an oscillator 82. In general, however, it operates in substantially the same way as the circuit in FIG. 10.

The tuning signal $V_{TUNE}$ generated by the master circuit 72 is then applied to the slave circuit 73, which includes one of the tunable filters according to the invention described above. The tunable filter varies the current supplied to the differential pair of transistors and the associated cascode transistors so that the transconductance of these transistors are varied accordingly. This in turn varies or tunes the corner frequency of the poles formed with the transconductances of these transistors. Thus, the corner frequency of the slave is tuned to the frequency of the CLOCK signal as is the filter/oscillator of the master. As a result, an accurate tunable filter has been achieved.

Having described and illustrated the principles of the invention in a preferred embodiment thereof, it should be apparent that the invention can be modified in arrangement and detail without departing from such principles. For example, complementary versions of the above-described circuits can be implemented using complementary transistors such as NPN transistors in place of PNP transistors and vice-versa. Certain additional modifications to the circuit would also be required to implement the complementary version, for example, different biasing circuitry, but would be apparent to those skilled in the art based on the description included herein. In addition, although the invention has been described with reference to master/slave techniques the filter is not limited to such techniques. The filter according to the invention can, for example, be used in adaptive filters. I claim all modifications and variation coming within the spirit and scope of the following claims.

What is claimed is:

1. A filter comprising:
    an amplifier having a pair of inputs and an output coupled to one of the pair of inputs, the amplifier having first and second differential transistor coupled together at a common node to form a differential pair of transistors, the amplifier having a current source coupled to the common node of the differential pair of transistors for biasing the differential pair of transistors;
    a first cascode transistor connected in series with the first differential transistor so that the current through the first differential transistor flows through the first cascode transistor;
    a second cascode transistor connected in series with the second differential transistor so that the current through the second differential transistor flows through the second cascode transistor; and
    a first cascode capacitor coupled between the first and second cascode transistors so that a filter pole is formed by the transconductance of the first and second cascode transistors and the capacitance of the first cascode capacitor.

2. A filter according to claim 1 wherein the current source includes a variable current source coupled to the differential pair of transistors to provide a variable current to the differential pair of transistors, wherein the filter pole is a function of the variable current.

3. A filter according to claim 2 wherein the variable current source includes an NPN transistor having a base for receiving a tuning signal, wherein the variable current is responsive to the tuning signal.

4. A filter according to claim 1 further comprising:
    a third cascode transistor connected in series with the first cascode transistor so that the current through the first cascode transistor flows through the third cascode transistor;
    a fourth cascode transistor connected in series with the second cascode transistor so that the current through the second cascode transistor flows through the fourth cascode transistor; and
    a second cascode capacitor coupled between the third and fourth cascode transistors so that a second filter pole is formed by the transconductance of the third and fourth cascode transistors and the capacitance of the second cascode capacitor.

5. A filter according to claim 1 wherein the first cascode transistor includes a first NPN transistor having a base coupled to a bias terminal for receiving a bias voltage, a collector coupled to a supply voltage terminal for receiving a common mode signal, and an emitter coupled to the first differential transistor; and
    wherein the second cascode transistor includes a second NPN transistor having a base coupled to the bias terminal for receiving the bias voltage, a collector coupled to the supply voltage terminal for receiving a common mode signal, and an emitter coupled to the second differential transistor.

6. A filter according to claim 5 wherein the first cascode capacitor is coupled between the emitters of the first and second NPN transistors.

7. A filter according to claim 6 wherein the amplifier includes:
    a current mirror transistor coupled between the supply voltage terminal and the collector of the first NPN transistor; and
    a diode-connected transistor coupled between the supply voltage terminal and the collector of the second NPN transistor.

8. A filter according to claim 1 wherein the first cascode transistor includes a first PNP transistor having a base, a collector coupled to a supply voltage terminal for receiving a common mode signal, and an emitter coupled to the first differential transistor;
    wherein the second cascode transistor includes a second PNP transistor having a base coupled to the base of the first PNP transistor, a collector coupled to the supply voltage terminal for receiving the common mode signal, and an emitter coupled to the second differential transistor; and
    wherein the cascode capacitor is coupled between the emitters of the first and second PNP transistors.

9. A tunable filter comprising:
    a filter input terminal for receiving an input signal and a filter output terminal for producing a filtered output signal;

a first differential transistor having a control terminal, an input terminal, and an output terminal, the control terminal coupled to the filter input terminal for receiving the input signal;

a second differential transistor having a control terminal coupled to the filter output terminal, an input terminal, and an output terminal connected to the output terminal of the first differential transistor;

a common mode current source having a supply voltage terminal for receiving a supply voltage and first and second common mode outputs, the first common mode output coupled to the input terminal of the first differential transistor and the second common mode output coupled to the input terminal of the second differential transistor;

a compensation capacitor coupled between the filter output terminal and the input terminal of the first differential transistor so that a first filter pole is formed by the transconductance of the differential transistors and the capacitance of the compensation capacitor; and a variable current source having an input terminal for receiving a tuning signal and an output terminal coupled to the output terminals of the first and second differential transistors for providing a variable current to the differential pair, wherein the corner frequency of the first filter pole is responsive to the tuning signal;

a first cascode transistor having a control terminal for receiving a first control signal, an output terminal coupled to the input terminal of the first differential transistor, an input terminal coupled to the first common mode output so that a current flowing through the first differential transistor flows through the first cascode transistor;

a second cascode transistor having a control terminal coupled to the control terminal of the first cascode transistor, an output terminal coupled to the input terminal of the second differential transistor, and an input terminal coupled to the second common mode output so that a current flowing through the second differential transistor flows through the second cascode transistor; and a first cascode capacitor coupled between the input terminals of the first and second cascode transistors so that a second filter pole is formed by the transconductance of the first and second cascode transistors and the capacitance of the first cascode capacitor, wherein the second filter pole tracks the first filter pole.

10. A tunable filter according to claim 9 further comprising:

a third cascode transistor having a control terminal for receiving a second control signal, an output terminal coupled to the input terminal of the first cascode transistor, and an input terminal coupled to the first common mode output so that the current flowing through the first cascode transistor flows through the third cascode transistor;

a fourth cascode transistor having a control terminal coupled to the control terminal of the third cascade transistor, an output terminal coupled to the input terminal of the second cascode transistor, and an input terminal coupled to the second common mode output so that a current flowing though the second cascade transistor flows through the fourth cascade transistor, and a second cascode capacitor coupled between the input terminals of the first and second cascode transistors so that a third filter pole is formed by the transconductance of the third and fourth transistors and the capacitance of the second cascode capacitor, wherein the third filter pole tracks the first filter pole.

11. A tunable filter according to claim 9 further comprising:

an output transistor having a control input coupled to the input of the first common mode output, an input terminal coupled to the supply terminal for receiving the supply signal, and an output terminal coupled to the filter output terminal; and a bias current source coupled to the output terminal of the output transistor for biasing the output transistor.

12. A tunable filter according to claim 11 wherein the bias current source includes a variable current source responsive to the tuning signal.

13. A tunable filter comprising:

a master circuit having a clock input for receiving a clock signal and a tuning output for providing a tuning signal that tunes the master circuit to the clock signal frequency; and a filter circuit having a signal input for receiving an input signal, a signal output for providing a filtered output signal, and a tuning input coupled to the tuning output of the master circuit for receiving the tuning signal, the filter circuit including:

first and second differential transistors connected together to form a differential pair of transistors, the differential pair having a first input coupled to the signal input for receiving the input signal and a second input coupled to the signal output, first and second outputs, and a common emitter node, a variable current source coupled to the common emitter node for providing a variable current to the differential pair of transistors, the variable current source having a control input coupled to the tuning input for receiving the tuning signal, the variable current being responsive to the tuning signal, a common mode biasing circuit having an input coupled to a supply voltage terminal for receiving a supply voltage, a first common mode output, and a second common mode output, a first cascode transistor connected between the first output of the differential pair and the first common mode output), a second cascode transistor connected between the second output of the differential pair and the second common mode output, and a cascode capacitor coupled across the first and second cascode transistors so as to form a filter pole with the first and second cascode transistors whose corner frequency is tunable responsive to the tuning signal.

14. A tunable filter according to claim 13 wherein the filter circuit includes a compensation capacitor coupled between the first output of the differential pair and the signal output of the filter circuit so that a compensation filter pole is formed by the transconductance of the differential pair and the capacitance of the compensation capacitor.

15. A tunable filter according to claim 13 wherein the filter circuit includes:

a third cascode transistor interposed between the first cascode transistor and the first output of the differential pair so that the current through the first cascode transistor passes through the third cascode transistor;

a fourth cascode transistor interposed between the second cascode transistor and the second output of the differential pair so that the current through the second cascode transistor passes through the fourth cascode transistor; and a second cascode capacitor coupled between the third and fourth cascode transistors so that a second filter pole is formed, wherein the second filter pole is responsive to the tuning signal to track the tuning signal.

* * * * *